United States Patent
Woo et al.

(10) Patent No.: US 11,929,472 B2
(45) Date of Patent: Mar. 12, 2024

(54) BATTERY DIAGNOSING APPARATUS AND METHOD

(71) Applicant: LG Energy Solution, Ltd., Seoul (KR)

(72) Inventors: Kyung-Hwa Woo, Daejeon (KR); Yoon-Jung Bae, Daejeon (KR); A-Ming Cha, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/922,410

(22) PCT Filed: Oct. 12, 2021

(86) PCT No.: PCT/KR2021/014053
§ 371 (c)(1),
(2) Date: Oct. 31, 2022

(87) PCT Pub. No.: WO2022/080837
PCT Pub. Date: Apr. 21, 2022

(65) Prior Publication Data
US 2023/0198038 A1    Jun. 22, 2023

(30) Foreign Application Priority Data
Oct. 12, 2020 (KR) .................... 10-2020-0131451

(51) Int. Cl.
*H01M 10/48* (2006.01)
*H01M 10/42* (2006.01)
*H01M 10/44* (2006.01)

(52) U.S. Cl.
CPC ....... *H01M 10/486* (2013.01); *H01M 10/425* (2013.01); *H01M 10/443* (2013.01); *H01M 2010/4271* (2013.01)

(58) Field of Classification Search
CPC . H01M 10/486; H01M 10/425; H01M 10/423
See application file for complete search history.

(56) References Cited

U.S. PATENT DOCUMENTS 10,502,791 B1    12/2019  Li et al.
2007/0054177 A1   3/2007  Yamashita et al.
(Continued)

FOREIGN PATENT DOCUMENTS

JP    2007103351 A    4/2007
JP     201389423 A    5/2013
(Continued)

OTHER PUBLICATIONS

International Search Report for Application No. PCT/KR2021/014053 dated Jan. 24, 2022, pp. 1-3.

*Primary Examiner* — Sarah A. Slifka
(74) *Attorney, Agent, or Firm* — BRYAN CAVE LEIGHTON PAISNER LLP

(57) ABSTRACT

A battery diagnosing apparatus includes a measuring unit configured to measure discharge capacity and temperature of a battery, an ohmic resistance determining unit configured to determine an ohmic resistance of the battery based on an impedance profile generated for the battery, and a control unit configured to calculate a capacity change rate by comparing the discharge capacity of the battery measured by the measuring unit with a reference capacity, calculate a resistance change rate by comparing the ohmic resistance determined by the ohmic resistance determining unit with a reference resistance, judge an internal gas generation level of the battery by comparing magnitudes of the calculated resistance change rate and a criterion resistance change rate, and judge an internal gas generation cause of the battery by comparing magnitudes of the calculated capacity change rate and a criterion capacity change rate.

13 Claims, 5 Drawing Sheets

(56) References Cited

U.S. PATENT DOCUMENTS

| | | |
|---|---|---|
| 2009/0004564 A1 | 1/2009 | Ishida et al. |
| 2017/0123013 A1 | 5/2017 | Tao et al. |
| 2018/0062210 A1 | 3/2018 | Kim |
| 2020/0018799 A1 | 1/2020 | Lim et al. |
| 2020/0271727 A1 | 8/2020 | Bae et al. |

FOREIGN PATENT DOCUMENTS

| | | |
|---|---|---|
| JP | 6148879 B2 | 6/2017 |
| KR | 100840459 B1 | 6/2008 |
| KR | 101583373 B1 | 1/2016 |
| KR | 20170083214 A | 7/2017 |
| KR | 20180024545 A | 3/2018 |
| KR | 20190036982 A | 4/2019 |
| KR | 20190118535 A | 10/2019 |
| KR | 20200027437 A | 3/2020 |
| KR | 102152572 B1 | 9/2020 |

| INTERNAL GAS GENERATION LEVEL \ INTERNAL GAS GENERATION CAUSE | ANOTHER CAUSE OTHER THAN SIDE REACTION OF NEGATIVE ELECTRODE | SIDE REACTION OF NEGATIVE ELECTRODE |
|---|---|---|
| LESS THAN CRITERION AMOUNT | NORMAL STATE | NORMAL STATE |
| EQUAL TO OR GREATER THAN CRITERION AMOUNT | FIRST WARNING STATE | SECOND WARNING STATE |

BATTERY DIAGNOSING APPARATUS AND METHOD

CROSS-REFERENCE TO RELATED APPLICATIONS

The present application is a national phase entry under 35 U.S.C. § 371 of International Application No. PCT/KR2021/014053 filed Oct. 12, 2021, which claims priority from Korean Patent Application No. 10-2020-0131451 filed Oct. 12, 2020, all of which are incorporated herein by reference.

TECHNICAL FIELD

The present disclosure relates to a battery diagnosing apparatus and method, and more particularly, to a battery diagnosing apparatus and method capable of diagnosing an internal gas generation level and an internal gas generation cause of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

As the battery is degraded, various side reactions accompanied by generation of internal gas occur. If the side reaction continues and the amount of internal gas exceeds an allowable value, the junction portion of the battery is opened, and the battery reaches an EOL (End Of Life) state.

Therefore, in order to diagnose the state of the battery, it is required to measure the internal gas amount, but in the prior art, it is difficult to measure the internal gas amount of the battery in a non-destructive manner.

SUMMARY

Technical Problem

The present disclosure is designed to solve the problems of the related art, and therefore the present disclosure is directed to providing a battery diagnosing apparatus and method for diagnosing an internal gas generation level and an internal gas generation cause of a battery in a non-destructive manner based on an impedance profile of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure may comprise: a voltage sensor configured to measure a voltage of a battery; a temperature sensor configured to measure a temperature of the battery; a controller; and memory having programmed thereon instructions that, when executed by the controller, cause the controller to: calculate a capacity change rate by comparing the discharge capacity of the battery with a reference capacity; calculate a resistance change rate by comparing an ohmic resistance determined based on an impedance profile generated for the battery with a reference resistance; determine an internal gas generation level of the battery by comparing magnitudes of the calculated resistance change rate and a threshold resistance change rate; and determine an internal gas generation cause of the battery by comparing magnitudes of the calculated capacity change rate and a threshold capacity change rate.

The ohmic resistance may be determined based on the impedance profile generated for the battery in response to the temperature of the battery being equal to or greater than a threshold temperature of the battery for a predetermined duration of time.

The apparatus may further include a current sensor configured to measure a discharge current of the battery, the battery may be configured to be maintained at or above the threshold temperature for the predetermined duration of time, and then to be fully charged and then fully discharged.

The instructions may be configured to cause the controller to receive a discharge capacity measurement of the battery based on discharge measurements of the current sensor, wherein the discharge capacity measurement is indicative of a discharge capacity of the battery between being fully charged and being fully discharged.

The instructions may be configured to cause the controller to determine that an internal gas of the battery equal to or greater than a threshold amount is generated in response to the calculated resistance change rate being equal to or greater than the threshold resistance change rate.

The instructions may be configured to cause the controller to determine that an internal gas of the battery less than the threshold amount is generated in response to the calculated resistance change rate being less than the threshold resistance change rate.

The instructions may be configured to cause the controller to determine that the internal gas generation cause is a side reaction of a negative electrode of the battery in response to the calculated capacity change rate being equal to or greater than the threshold capacity change rate.

The instructions may be configured to cause the controller to determine that the internal gas generation cause is a cause other than the side reaction of the negative electrode in response to the calculated capacity change rate being less than the criterion capacity change rate.

The instructions may be configured to cause the controller to diagnose a state of the battery based on the internal gas generation level and the internal gas generation cause.

The instructions may be configured to cause the controller to diagnose that the state of the battery is a normal state in response to the internal gas generation level being less than the threshold amount.

The instructions may be configured to cause the controller to diagnose that the state of the battery is a first warning state in response to the internal gas generation level being greater than or equal to the threshold amount and reduce an upper limit temperature for the battery in response to the state of the battery being the first warning state.

The instructions may be configured to cause the controller to diagnose that the state of the battery is a second warning state in response to the internal gas generation level being equal to or greater than the threshold amount and being generated due to the side reaction of the negative electrode and reduce at least one of an upper limit temperature and an upper limit C-rate for the battery in response to the state of the battery being the second warning state.

A battery diagnosing system according to another aspect of the present disclosure may comprise: the battery diagnosing apparatus according to an aspect of any of the embodiments of the present disclosure; and an electrochemical impedance spectroscopy (EIS) instrument configured to: output an AC current to the battery; generate the impedance profile of the battery according to an output result of the AC current as a corresponding relationship between a real part and an imaginary part; and output the generated impedance profile to the battery diagnosing apparatus.

A battery diagnosing system according to another aspect of the present disclosure may further comprise a heater configured to raise the temperature of the battery to a raised temperature equal to or greater than a threshold temperature; and a charging and discharging unit configured to charge and discharge the battery.

A battery pack according to still another aspect of the present disclosure may comprise the battery diagnosing apparatus according to an aspect of any of the embodiments of the present disclosure.

A battery diagnosing method according to still another aspect of the present disclosure may comprise: measuring, by a temperature sensor, a temperature of a battery; measuring, by a current sensor, a discharge current of the battery; receiving, by a controller, a discharge capacity of the battery based on discharge current measurements of the current sensor; calculating, by a controller, a capacity change rate by comparing the received discharge capacity of the battery with a reference capacity; calculating, by the controller, a resistance change rate by comparing an ohmic resistance of the battery determined based on an impedance profile generated for the battery with a reference resistance; determining, by the controller, an internal gas generation level of the battery by comparing magnitudes of the calculated resistance change rate and a threshold resistance change rate; and determining, by the controller, an internal gas generation cause of the battery by comparing magnitudes of the calculated capacity change rate and a threshold capacity change rate.

Advantageous Effects

According to one aspect of the present disclosure, an internal gas generation level and an internal gas generation cause of a battery may be diagnosed in a non-destructive manner.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, terms such as a control unit described in the specification mean a unit that processes at least one function or operation, which may be implemented as hardware or software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
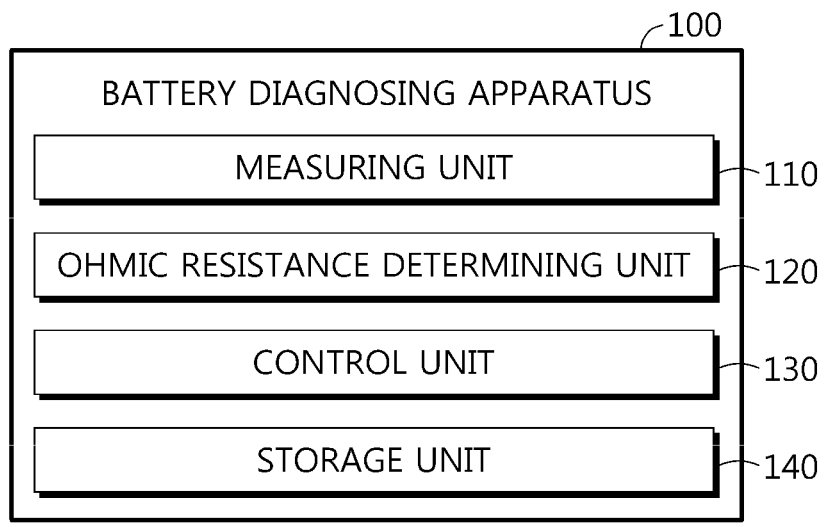
FIG. 1 is a diagram schematically showing a battery diagnosing apparatus according to an embodiment of the present disclosure.

FIG. 1 is a diagram schematically showing a battery diagnosing apparatus 100 according to an embodiment of the present disclosure.

Referring to FIG. 1, the battery diagnosing apparatus 100 according to an embodiment of the present disclosure may include a measuring unit 110, an ohmic resistance determining unit 120, and a control unit 130.

The measuring unit 110 may be configured to measure discharge capacity and temperature of a battery.

Here, the battery means a single independent cell that has a negative electrode terminal and a positive electrode terminal and is physically separable. For example, one pouch-type lithium polymer cell may be regarded as a battery. Also, the battery may be a battery module in which one or more batteries are connected in series and/or in parallel. However, hereinafter, for convenience of explanation, a battery will be described as meaning an independent cell.

For example, the measuring unit 110 may measure the discharge capacity of the battery for a predetermined time by measuring a discharge current of the battery.

In addition, the measuring unit 110 may be connected to the battery to measure a current temperature of the battery.

The ohmic resistance determining unit 120 may be configured to determine an ohmic resistance of the battery based on an impedance profile generated for the battery.

Figure 2:
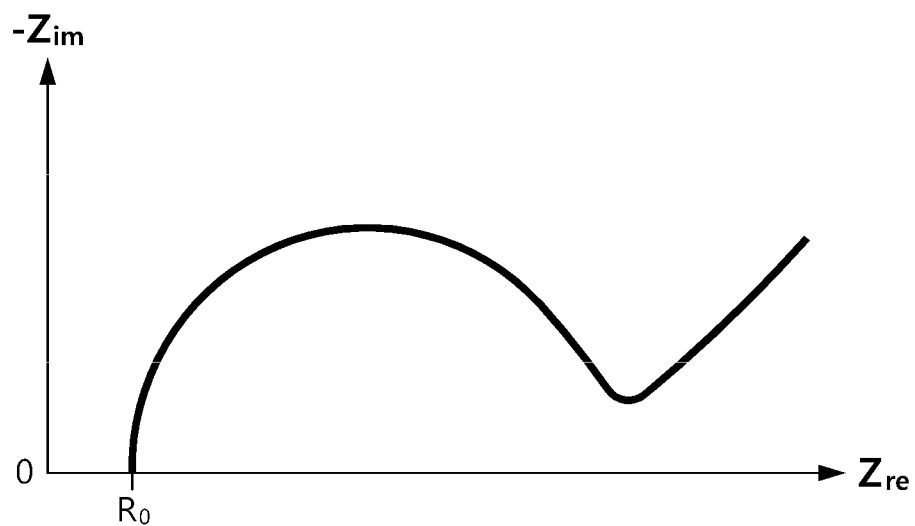
FIG. 2 is a diagram schematically showing an impedance profile according to an embodiment of the present disclosure.

FIG. 2 is a diagram schematically showing an impedance profile according to an embodiment of the present disclosure.

Referring to FIG. 2, the impedance profile may be expressed as an X-Y plane graph when X is set as a real part (Zre) and Y is set as an imaginary part (-Zim). In the embodiment of FIG. 2, the ohmic resistance (Ro) of the battery may be a starting resistance value of the impedance profile. Specifically, in the impedance profile, the resistance value of the real part (Zre) when the value of the imaginary part (-Zim) is 0 may be the ohmic resistance (Ro) of the battery. Since the ohmic resistance (Ro) is a widely known factor, it should be noted that a description of the ohmic resistance (Ro) will be omitted.

For example, the impedance profile of the battery may be generated outside the battery diagnosing apparatus 100. In addition, the ohmic resistance determining unit 120 may directly receive the impedance profile of the battery generated in the outside or may acquire the impedance profile by accessing a memory in which the impedance profile of the battery is stored.

Then, the ohmic resistance determining unit 120 may determine a starting resistance value from the received impedance profile, and determine the determined starting resistance value as the ohmic resistance of the battery.

The control unit 130 may be configured to calculate a capacity change rate by comparing the discharge capacity of the battery measured by the measuring unit 110 with a reference capacity.

Here, the reference capacity may be a discharge capacity of a battery until the battery in a BOL (Beginning Of Life) state is shifted from a fully charged state to a fully discharged battery. For example, the reference capacity may be the discharge capacity of the battery measured while the battery in the BOL state is discharged from 100% SOC (State Of Charge) to 0% SOC.

Specifically, the control unit 130 may calculate a capacity change rate for the battery by calculating a ratio of a difference between the reference capacity and the measured discharge capacity of the battery for the reference capacity. For example, the control unit 130 may calculate a capacity change rate for the battery by calculating the formula "(reference capacity−measured discharge capacity of a battery) reference capacity×100".

Figure 3:
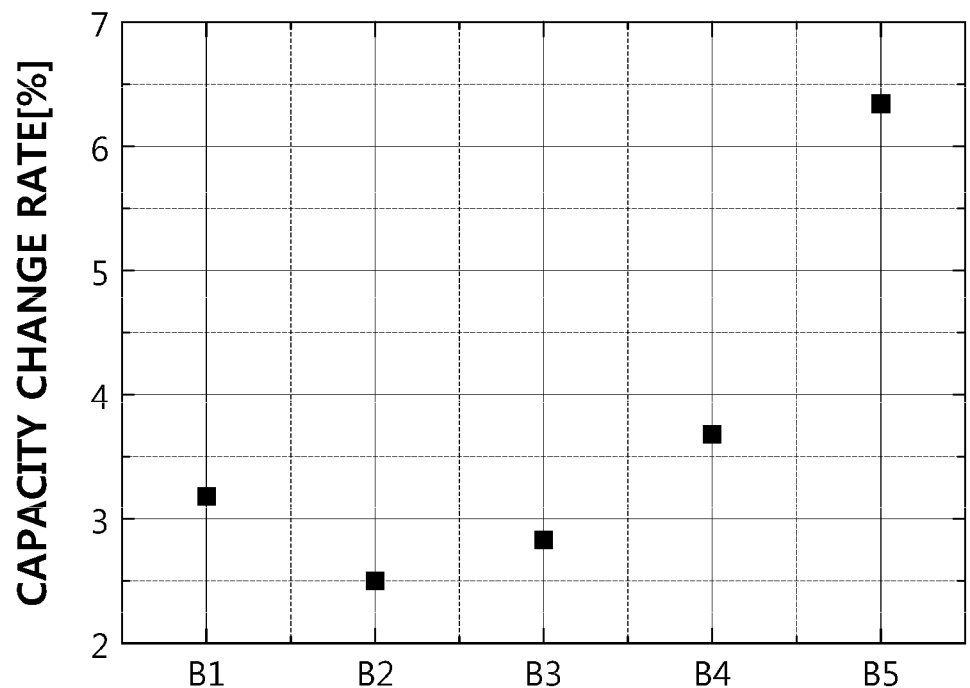
FIG. 3 is a diagram showing an example of a capacity change rate calculated by the battery diagnosing apparatus according to an embodiment of the present disclosure.

FIG. 3 is a diagram showing an example of the capacity change rate calculated by the battery diagnosing apparatus 100 according to an embodiment of the present disclosure.

For example, in the embodiment of FIG. 3, the control unit 130 may calculate a capacity change rate for first to fifth batteries B1 to B5. Here, the reference capacity may be preset for each of the first to fifth batteries B1 to B5. That is, a first reference capacity for the first battery B1 and a second reference capacity for the second battery B2 may be preset. In addition, a third reference capacity for the third battery B3 and a fourth reference capacity for the fourth battery B4 may be preset. Also, a fifth reference capacity for the fifth battery B5 may be preset.

That is, the control unit 130 does not calculate the capacity change rate of the first to fifth batteries B1 to B5 by using one preset reference capacity, but may calculate the capacity change rate for each of the first to fifth batteries B1 to B5 by calculating the difference between the corresponding reference capacity and the measured discharge capacity of the battery. Accordingly, the degree of degradation of each battery may be reflected in the capacity change rate of the battery calculated by the control unit 130.

For example, in the embodiment of FIG. 3, the capacity change rate of the first battery B1 may be 3.17%, and the capacity change rate of the second battery B2 may be 2.5%. Also, the capacity change rate of the third battery B3 may be 2.83%, and the capacity change rate of the fourth battery B4 may be 3.67%. Also, the capacity change rate of the fifth battery B5 may be 6.33%.

The control unit 130 may be configured to calculate a resistance change rate by comparing the ohmic resistance determined by the ohmic resistance determining unit 120 with a reference resistance.

Here, the reference resistance may be a resistance value measured in advance for the battery in the BOL state. More preferably, the reference resistance may be an ohmic resistance value measured when the SOC (State Of Charge) of the battery in the BOL state is 100%.

Specifically, the control unit 130 may calculate a resistance change rate for the battery by calculating a ratio of a difference between the reference resistance and the measured ohmic resistance of the battery for the reference resistance. For example, the control unit 130 may calculate the resistance change rate for the battery by calculating the formula "(measured ohmic resistance of the battery−reference resistance) reference resistance×100".

Figure 4:
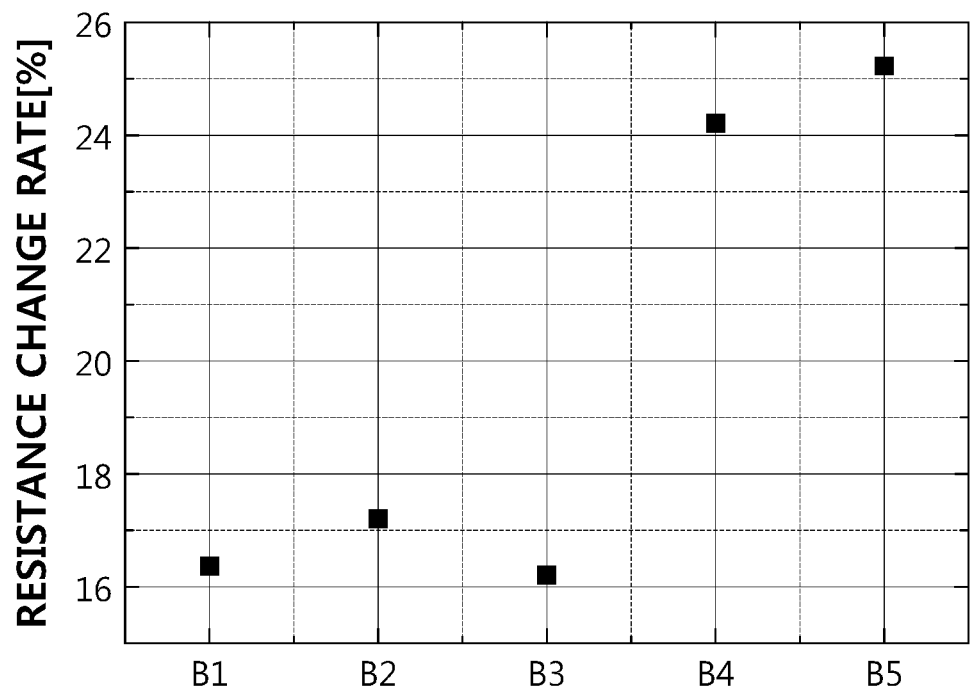
FIG. 4 is a diagram showing an example of a resistance change rate calculated by the battery diagnosing apparatus according to an embodiment of the present disclosure.

FIG. 4 is a diagram showing an example of the resistance change rate calculated by the battery diagnosing apparatus 100 according to an embodiment of the present disclosure.

For example, in the embodiment of FIG. 4, the control unit 130 may calculate a resistance change rate of the first to fifth batteries B1 to B5. Like the reference capacity, the reference resistance may also be preset for each of the first to sixth fifth batteries B1 to B5. That is, a first reference resistance for the first battery B1 and a second reference resistance for the second battery B2 may be preset. In addition, a third reference resistance for the third battery B3 and a fourth reference resistance for the fourth battery B4 may be preset. In addition, a fifth reference resistance for the fifth battery B5 may be preset. In addition, the control unit 130 may calculate a resistance change rate of each of the first to fifth batteries B1 to B5 based on the corresponding reference resistance and the ohmic resistance of the battery.

For example, in the embodiment of FIG. 4, the resistance change rate of the first battery B1 may be 16.4%, and the resistance change rate of the second battery B2 may be 17.1%. In addition, the resistance change rate of the third battery B3 may be 16.1%, and the resistance change rate of the fourth battery B4 may be 24.2%. In addition, the resistance change rate of the fifth battery B5 may be 25.2%.

The control unit 130 may be configured to judge an internal gas generation level of the battery by comparing magnitudes of the calculated resistance change rate and a criterion resistance change rate.

Specifically, the control unit 130 may be configured to judge that an internal gas of the battery equal to or greater than a criterion amount is generated, when the calculated resistance change rate is equal to or greater than the criterion resistance change rate. In addition, the control unit 130 may be configured to judge that an internal gas of the battery less than the criterion amount is generated, when the calculated resistance change rate is less than the criterion resistance change rate. Here, the case where the internal gas of the battery less than the criterion amount is generated may include both the case where the internal gas of the battery less than the criterion amount is generated and the case where the internal gas is not generated.

For example, in the embodiment of FIG. 4, it is assumed that the criterion resistance change rate is preset to 20%. Since the resistance change rates of the first to third batteries B1 to B3 are smaller than the criterion resistance change rate, the control unit 130 may judge that the internal gas of the first to third batteries B1 to B3 less than the criterion amount is generated. In addition, since the resistance change rates of the fourth and fifth batteries B4, B5 are greater than the criterion resistance change rate, the control unit 130 may judge that the internal gas of the fourth and fifth batteries B4, B5 greater than the criterion amount is generated.

The control unit 130 may be configured to judge an internal gas generation cause of the battery by comparing magnitudes of the calculated capacity change rate and a criterion capacity change rate.

Specifically, the control unit 130 may be configured to judge that the internal gas generation cause is a side reaction of the negative electrode of the battery, when the calculated capacity change rate is greater than or equal to the criterion capacity change rate. More preferably, the control unit 130 may be configured to judge that the internal gas generation cause is a side reaction of the negative electrode and an electrolyte of the battery, when the calculated capacity change rate is greater than or equal to the criterion capacity change rate.

In addition, the control unit 130 may be configured to judge that the internal gas generation cause is another cause other than the side reaction of the negative electrode, when the calculated capacity change rate is less than the criterion capacity change rate. For example, another cause may include a side reaction of the positive electrode of the battery.

For example, in the embodiment of FIG. 3, it is assumed that the criterion capacity change rate is preset to 5%. Since the capacity change rates of the first to fourth batteries B1 to B4 are smaller than the criterion capacity change rate, the control unit 130 may judge that the internal gases of the first to fourth batteries B1 to B4 are caused by another cause. In addition, since the capacity change rate of the fifth battery B5 is greater than the criterion capacity change rate, the control unit 130 may judge that the internal gas of the fifth battery B5 is generated by the side reaction of the negative electrode of the corresponding battery.

That is, the battery diagnosing apparatus 100 according to an embodiment of the present disclosure may judge whether the internal gas of the battery equal to or greater than the criterion amount is generated and whether the internal gas of the battery is generated due to any side reaction. In particular, the battery diagnosing apparatus 100 has an advantage of diagnosing in a non-destructive manner whether the internal gas of the battery is generated due to the side reaction of the negative electrode of the battery.

For example, when diagnosing the state of one or more batteries collected for reuse, the battery diagnosing apparatus 100 according to an embodiment of the present disclosure may be used. The battery diagnosing apparatus 100 may diagnose the internal gas generation level and the internal gas generation cause for each of one or more batteries in a non-destructive manner. Therefore, according to an embodiment of the present disclosure, because the internal gas generation level and the internal gas generation cause of the battery may be quickly and easily diagnosed based on the ohmic resistance and the discharge capacity of the battery, it may be judged quickly and accurately whether the collected batteries are reusable.

Meanwhile, the control unit 130 provided to the battery diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 130 may be implemented as a set of program modules. At this time, the program module may be stored in a memory and executed by the control unit 130. The memory may be provided in or out of the control unit 130, and may be connected to the control unit 130 by various well-known means.

In addition, referring to FIG. 1, the battery diagnosing apparatus 100 may further include a storage unit 140. The storage unit 140 may store data or programs necessary for operation and function of each component of the battery diagnosing apparatus 100, data generated in the process of performing the operation or function, or the like. The storage unit 140 is not particularly limited in its kind as long as it is a known information storage means that can record, erase, update and read data. As an example, the information storage means may include random-access memory (RAM), flash memory, read-only memory (ROM), electrically erasable programmable read-only memory (EEPROM), registers, and the like. In addition, the storage unit 140 may store program codes in which processes executable by the control unit 130 are defined.

For example, the storage unit 140 may store a reference capacity and a reference resistance for each battery. In addition, the storage unit 140 may store the impedance profile of the battery. In this case, the ohmic resistance determining unit 120 may access the storage unit 140 to obtain the impedance profile of the battery.

Preferably, the ohmic resistance determining unit 120 may be configured to determine the ohmic resistance based on the impedance profile generated for the battery, when a temperature of the battery measured by the measuring unit 110 is equal to or greater than a criterion temperature during a predetermined period.

Here, the predetermined period may be a minimum period in which the temperature of the battery must be maintained at the criterion temperature or above so that the change in the ohmic resistance of the battery may be related to the generation of internal gas of the battery. That is, if the temperature of the battery is maintained at the criterion temperature or above only during too short a period, the generated internal gas of the battery may not be significantly related to the change in the ohmic resistance of the battery.

Therefore, in the present disclosure, by maintaining the temperature of the battery at the criterion temperature or above during a predetermined period, it is possible to make judgment by correlating the change in the ohmic resistance of the battery and the internal gas generation level of the battery.

For example, the criterion temperature may be set to any one of 40° C. to 60° C. Preferably, the criterion temperature may be set to 40° C. In addition, the predetermined period may be set to any one of 3 days to 8 days. Preferably, the predetermined period may be set to 3 days.

As a specific example, it is assumed that the criterion temperature is set to 40° C. and the predetermined period is set to 3 days. When the temperature of the battery measured by the measuring unit 110 is maintained at 40° C. or above for 3 days, the ohmic resistance determining unit 120 may determine the ohmic resistance for the corresponding battery by acquiring the impedance profile for the corresponding battery.

In general, as the SOC and temperature of the battery are higher, the internal gas generation amount of the battery may be increased. That is, in order to diagnose the internal gas generation level and the internal gas generation cause for the purpose of judging whether the battery is reusable, the battery diagnosing apparatus 100 according to an embodiment of the present disclosure may perform diagnosis for a battery that is maintained at the criterion temperature or above during a predetermined period.

Also, preferably, the battery may be initially fully charged to the SOC 100% state. In addition, the fully charged battery may be maintained at the criterion temperature or above for a predetermined period. That is, during the predetermined period, the fully charged battery may be gradually discharged naturally, but the temperature of the battery may be configured to be maintained at the criterion temperature or above.

In addition, like the ohmic resistance determining unit 120, the measuring unit 110 may also measure the discharge capacity only for a battery whose temperature is maintained at the criterion temperature or above for a predetermined period, and the control unit 130 may diagnose the internal gas generation level and the internal gas generation cause only for the corresponding battery.

Here, the battery may be fully charged again at a first time point after the battery is maintained at the criterion temperature or above for the predetermined period, and may be configured to be fully discharged at a second time point after the battery is fully charged at the first time point. Preferably, the measuring unit 110 may be configured to measure the discharge capacity of the battery until the battery fully charged at the first time point is fully discharged at the second time point.

For example, after the temperature of the battery is maintained at 40° C. or above for 3 days as in the previous embodiment, the battery may be fully charged to SOC 100% at the first time point. In addition, at the second time point later than the first time point, the battery may be fully discharged to SOC 0%. The measuring unit 110 may measure the discharge capacity of the battery from the first time point to the second time point. In addition, the control unit 130 may calculate a capacity change rate of the battery based on the discharge capacity measured by the measuring unit 110. That is, the control unit 130 may calculate a loss rate of the irreversible capacity of the battery.

That is, the battery diagnosing apparatus 100 may judge whether the internal gas of the battery is generated, and, if generated, due to which cause the internal gas of the battery is generated, only when the fully charged battery is maintained at the criterion temperature or above for a predetermined period, in order to create a test environment in which the internal gas of the battery may be generated.

Hereinafter, an embodiment in which the battery diagnosing apparatus 100 diagnoses the state of the battery according to the diagnosed internal gas generation level and the internal gas generation cause of the battery will be described in detail.

The control unit 130 may be configured to diagnose the state of the battery based on the internal gas generation level and the internal gas generation cause.

Hereinafter, for convenience of explanation, the state of the battery that may be judged by the control unit 130 is divided into a normal state, a first warning state, and a second warning state. However, the state of the battery that may be judged by the control unit 130 may be further subdivided according to the internal gas generation level and the internal gas generation cause of the battery. For example, the control unit 130 may specifically subdivide and diagnose the internal gas generation level of the battery by comparing the calculated resistance change rate of the battery with a criterion resistance range divided into a plurality of sections. In addition, the control unit 130 may compare the calculated capacity change rate of the battery with a criterion capacity range divided into a plurality of capacity sections to subdivide and diagnose the internal gas generation cause of the battery in more detail. Also, it should be noted that the state of the battery may be specifically diagnosed in more various aspects by the internal gas generation level and the internal gas generation cause that are subdivided and diagnosed.

Figures 5, 6:
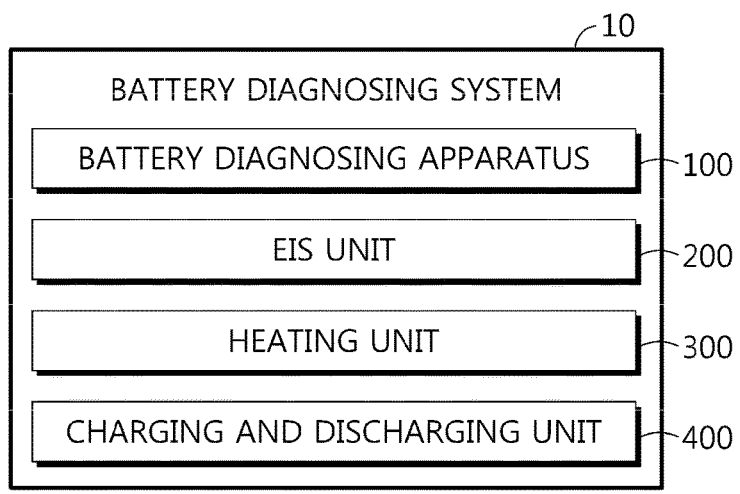
FIG. 5 is a diagram schematically showing a state of a battery diagnosed by the battery diagnosing apparatus according to an embodiment of the present disclosure.
FIG. 6 is a diagram schematically showing a battery diagnosing system according to another embodiment of the present disclosure.

FIG. 5 is a diagram schematically showing a state of a battery diagnosed by the battery diagnosing apparatus 100 according to an embodiment of the present disclosure.

Referring to FIG. 5, the control unit 130 may be configured to diagnose that the state of the battery is a normal state, when it is judged that the internal gas less than the criterion amount is generated.

That is, even if a fully charged battery is placed in a situation of the criterion temperature or above for a predetermined period, if the internal gas less than the criterion amount is generated, the control unit 130 may diagnose that the state of the battery is a normal state. In addition, the control unit 130 may classify the battery as a reusable battery.

In addition, referring to FIG. 5, the control unit 130 may be configured to diagnose that the state of the battery is a first warning state, when it is judged that the internal gas equal to or greater than the criterion amount is generated due to another cause. In addition, the control unit 130 may classify the battery as a reusable battery.

Thereafter, the control unit 130 may be configured to decrease an upper limit temperature of the battery in order to reduce the internal gas generation amount of the battery diagnosed as the first warning state. That is, the battery diagnosed as the first warning state may be set by the control unit 130 so that the allowable upper limit temperature is reduced. That is, when the battery diagnosed as the first warning state is reused, the allowable upper limit temperature for the battery may be limited to the temperature set by the control unit 130.

In addition, referring to FIG. 5, the control unit 130 may be configured to diagnose that the state of the battery is a second warning state, when it is judged that the internal gas equal to or greater than the criterion amount is generated by the side reaction of the negative electrode. In addition, the control unit 130 may classify the battery as a reusable battery.

Thereafter, the control unit 130 may be configured to decrease at least one of an upper limit temperature and an upper limit C-rate for the battery in order to decrease the internal gas generation amount of the battery diagnosed as the second warning state. That is, the battery diagnosed as the second warning state may be set by the control unit 130 such that at least one of the allowable upper limit temperature and the allowable upper limit C-rate is reduced. Preferably, the control unit 130 may reduce both the upper limit temperature and the upper limit C-rate of the battery in order to effectively reduce the internal gas generation amount of the battery diagnosed as the second warning state. That is, when the battery diagnosed as the second warning state is reused, at least one of the upper limit temperature and the upper limit C-rate allowable for the corresponding battery may be limited to a value set by the control unit 130.

Specifically, the control unit 130 may diagnose that the state of the battery having the internal gas generation level equal to or greater than the criterion amount is a warning state, and decrease the upper limit temperature and/or the upper limit C-rate in order to reduce the internal gas generation amount.

In summary, the control unit 130 may classify a battery diagnosed as the normal state, the first warning state or the second warning state as a reusable battery. In addition, the control unit 130 may reduce the internal gas generation amount of the battery when the battery is reused by appropriately restricting the operation of the battery diagnosed as the first warning state or the second warning state.

As such, the battery diagnosing apparatus 100 according to an embodiment of the present disclosure may diagnose the state of the battery by focusing on whether the battery is reusable based on the internal gas generation level and the internal gas generation cause of the battery. In addition, in order to reduce generation of internal gas during reuse, the operation of each battery may be limited based on the diagnosed state. Therefore, the battery diagnosing apparatus 100 has an advantage of not only judging whether to the battery is reusable, but also setting appropriate control conditions so that the battery may be used for a longer period.

FIG. 6 is a diagram schematically showing a battery diagnosing system 10 according to another embodiment of the present disclosure.

Referring to FIG. 5, the battery diagnosing system 10 may include a battery diagnosing apparatus 100 according to an embodiment of the present disclosure and an electrochemical impedance spectroscopy (EIS) unit 200.

The EIS unit 200 may be configured to output an alternating current (AC) to the battery and generate an impedance profile representing the impedance of the battery as a corresponding relationship between the real part (Zre) and the imaginary part (-Zim) according to the output result of the AC current.

Specifically, the EIS unit 200 may be configured to perform EIS (Electrochemical Impedance Spectroscopy). Therefore, the EIS unit 200 may apply a minute AC current to the battery to measure the impedance of the battery, and generate an impedance profile representing the impedance as a corresponding relationship between the real part (Zre) and the imaginary part (-Zim).

For example, when the temperature of the battery is equal to or higher than the criterion temperature, the impedance of the battery measured by the EIS unit 200 may be inaccurate due to the influence of temperature. Therefore, the EIS unit 200 may measure the impedance of the battery when the temperature of the battery becomes close to room temperature.

The EIS unit 200 may be configured to output the generated impedance profile to the battery diagnosing apparatus 100.

For example, the EIS unit 200 may transmit the generated impedance profile to the ohmic resistance determining unit 120 of the battery diagnosing apparatus 100.

As another example, the EIS unit 200 may transmit the generated impedance profile to the storage unit 140 of the battery diagnosing apparatus 100. In this case, the ohmic resistance determining unit 120 may access the storage unit 140 to acquire the impedance profile generated by the EIS unit 200.

Also, referring to FIG. 6, the battery diagnosing system 10 may further include a heating unit 300 and a charging and discharging unit 400.

The heating unit 300 may be configured to increase the temperature of the battery so that the temperature of the battery is equal to or higher than a criterion temperature. That is, the heating unit 300 may raise and maintain the temperature of the battery so that the temperature of the battery may be maintained at the criterion temperature or above for a predetermined period.

The charging and discharging unit 400 may be configured to be connected to a battery to charge or discharge the battery.

For example, the battery may be fully charged by the charging and discharging unit 400 at an initial time point. In addition, the temperature of the battery may be maintained at the criterion temperature or above by the heating unit 300 for a predetermined period. The charging and discharging unit 400 may fully charge the battery again at a first time point after a predetermined period has elapsed. That is, the SOC of the battery at the first time point may be 100%. In addition, at the second time point later than the first time point, the charging and discharging unit 400 may fully discharge the battery. That is, the SOC of the battery at the second time point may be 0%. The measuring unit 110 may measure the discharge capacity of the battery from the first time point to the second time point. In addition, the control unit 130 may diagnose the internal gas generation level, the internal gas generation cause and the state of the battery.

Therefore, the battery diagnosing system 10 has an advantage of diagnosing whether the battery is reusable by satisfying the test conditions in which the internal gas of the battery may be generated.

On the other hand, in preparation for judging that the internal gas of the battery equal to or greater than the criterion amount is generated and the internal gas generation cause is diagnosed as another cause other than the side reaction of the negative electrode, the battery diagnosing apparatus 100 may perform additional diagnosis to specifically identify the internal gas generation cause of the battery. That is, the battery diagnosing apparatus 100 may perform additional diagnosis in order to specifically diagnose the internal gas generation cause of the battery in preparation for judging that the state of the battery as the first warning state.

The measuring unit 110 may be configured to further measure a voltage of the battery. Preferably, the measuring unit 110 may measure the voltage of a battery that is maintained at the criterion temperature or above for a predetermined period. More preferably, the measuring unit 110 may measure an OCV (Open Circuit Voltage) of the battery.

The control unit 130 may be configured to calculate a voltage change amount by comparing the voltage of the battery measured by the measuring unit 110 with a reference voltage.

Here, the reference voltage may be a voltage value measured in advance for a battery in the BOL state. More preferably, the reference voltage may be an OCV value measured when the SOC of the battery in the BOL state is 100%.

Specifically, the control unit 130 may calculate the voltage change amount for the battery by calculating a difference between the reference voltage and the measured voltage of the battery. For example, the control unit 130 may calculate the voltage change amount for the battery by calculating the formula "reference voltage—measured voltage of the battery".

In addition, if the calculated voltage change amount is greater than or equal to the criterion voltage change amount, the control unit 130 may be configured to judge that the internal gas generation cause of the battery is a side reaction of the positive electrode.

In addition, the control unit 130 may be configured to diagnose that the state of the battery is a third warning state, when it is judged that the internal gas of the battery equal to or greater than the criterion amount is generated by the side reaction of the positive electrode. In addition, the control unit 130 may classify the battery as a reusable battery.

Thereafter, the control unit 130 may be configured to reduce at least one of the upper limit temperature and the upper limit SOC for the battery in order to reduce the internal gas generation amount of the battery diagnosed as the third warning state. That is, the battery diagnosed as the third warning state may be set by the control unit 130 such that at least one of the allowable upper limit temperature and the upper limit SOC is reduced. That is, when a battery diagnosed as the third warning state is reused, the allowable upper limit temperature and/or the upper limit SOC for the battery may be limited to a value set by the control unit 130.

The battery diagnosing apparatus 100 according to the present disclosure may be applied to a BMS (Battery Management System). That is, the BMS according to the present disclosure may include the battery diagnosing apparatus 100 described above. In this configuration, at least some components of the battery diagnosing apparatus 100 may be implemented by supplementing or adding functions of the configuration included in the conventional BMS.

In addition, the battery diagnosing apparatus 100 according to the present disclosure may be provided to a battery pack. That is, the battery pack according to the present disclosure may include the above-described battery diagnosing apparatus 100 and at least one battery. In addition, the battery pack may further include electrical equipment (a relay, a fuse, etc.) and a case.

Figure 7:
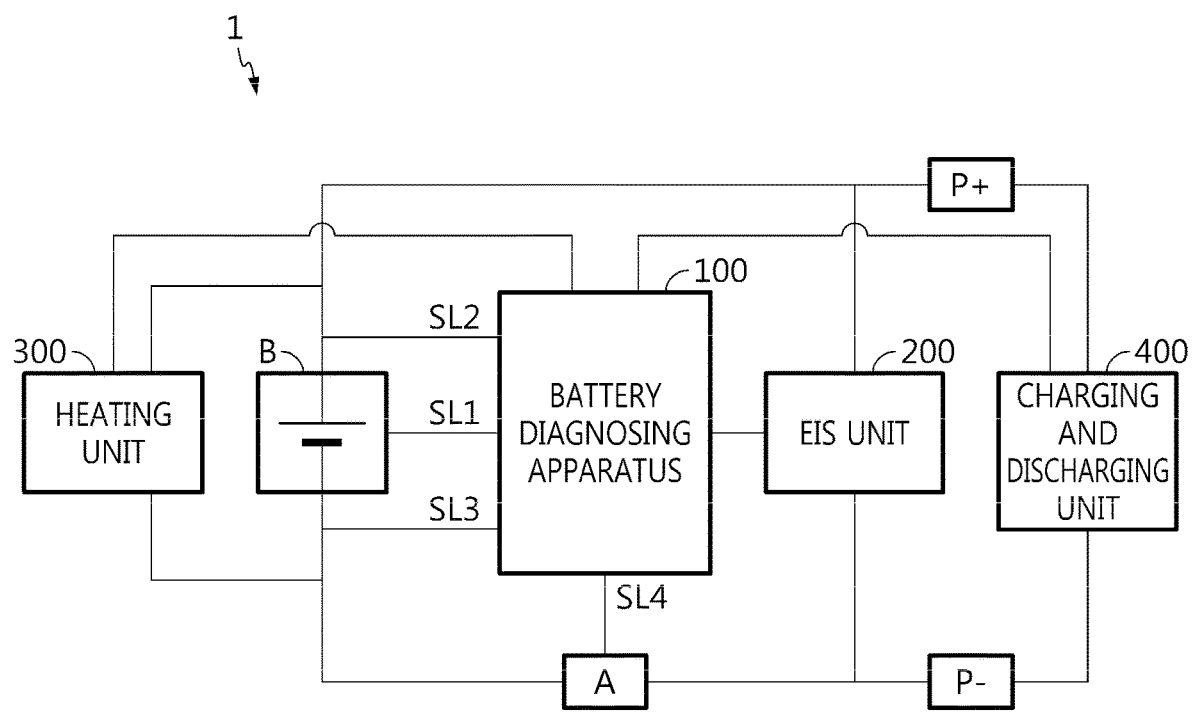
FIG. 7 is a diagram showing an exemplary configuration of a battery pack including the battery diagnosing apparatus according to an embodiment of the present disclosure.

FIG. 7 is a diagram schematically showing an exemplary configuration of a battery pack 1 according to still another embodiment of the present disclosure. Referring to FIG. 7, the battery pack 1 may include a battery diagnosing apparatus 100, an EIS unit 200, a heating unit 300, and a charging and discharging unit 400. That is, the battery pack 1 may include the battery diagnosing system 10.

For example, in the embodiment of FIG. 7, the battery diagnosing apparatus 100 may be connected to first to fourth sensing lines SL1 to SL4. Preferably, the first to fourth sensing lines SL1 to SL4 may be connected to the measuring unit 110 of the battery diagnosing apparatus 100.

The measuring unit 110 may measure the temperature of the battery B through the first sensing line SL1.

In addition, the measuring unit 110 may measure a positive electrode discharge capacity of the battery B through the second sensing line SL2 and measure a negative electrode discharge capacity of the battery B through the third sensing line SL3. In addition, the measuring unit 110 may measure the discharge capacity of the battery B by calculating a difference between the measured positive electrode discharge capacity and negative electrode discharge capacity of the battery B.

Also, the measuring unit 110 may be connected to a current measuring element A through the fourth sensing line SL4. Here, the current measuring element A may be a current system or a shunt resistor. Therefore, the measuring unit 110 may measure the current of the battery B through the fourth sensing line SL4. FIG. 7 shows an embodiment in which the current measuring element A is provided between a negative electrode of the battery B and a negative electrode terminal P– of the battery pack 1 as a preferred embodiment, but the current measuring element A may also be provided between a positive electrode of the battery B and a positive electrode terminal P+ of the battery pack 1.

One end of the EIS unit 200 may be connected between the positive electrode terminal P+ of the battery pack 1 and the positive electrode of the battery B, and the other end may be connected between the negative electrode terminal P– of the battery pack 1 and the negative electrode of the battery B. In addition, the EIS unit 200 may measure the impedance of the battery B after outputting a minute AC current. Thereafter, the EIS unit 200 may generate an impedance profile of the battery B and transmit it to the battery diagnosing apparatus 100.

One end of the heating unit 300 may be connected to the positive electrode of the battery B, and the other end may be connected to the negative electrode of the battery cell B. In addition, the operation of the heating unit 300 is controlled by the battery diagnosing apparatus 100 (particularly, the control unit 130), and when the heating unit 300 is operated, the temperature of the battery B may increase.

One end of the charging and discharging unit 400 may be connected to the positive electrode terminal P+ of the battery pack 1, and the other end may be connected to the negative electrode terminal P– of the battery pack 1. In another embodiment, one end of the charging and discharging unit 400 may be directly connected to the positive electrode of the battery B, and the other end may be directly connected to the negative electrode of the battery B, similarly to the heating unit 300. The operation of the charging and discharging unit 400 may be controlled by the battery diagnosing apparatus 100 (particularly, the control unit 130), and when the charging and discharging unit 400 is operated, the battery B may be charged or discharged.

For example, the battery B may be fully charged by the charging and discharging unit 400. In addition, by the heating unit 300, the temperature of the battery B may be maintained at the criterion temperature or above for a predetermined period. Thereafter, the internal gas generation level, the internal gas generation cause and the state of the battery B may be diagnosed by the battery diagnosing apparatus 100.

Figure 8:
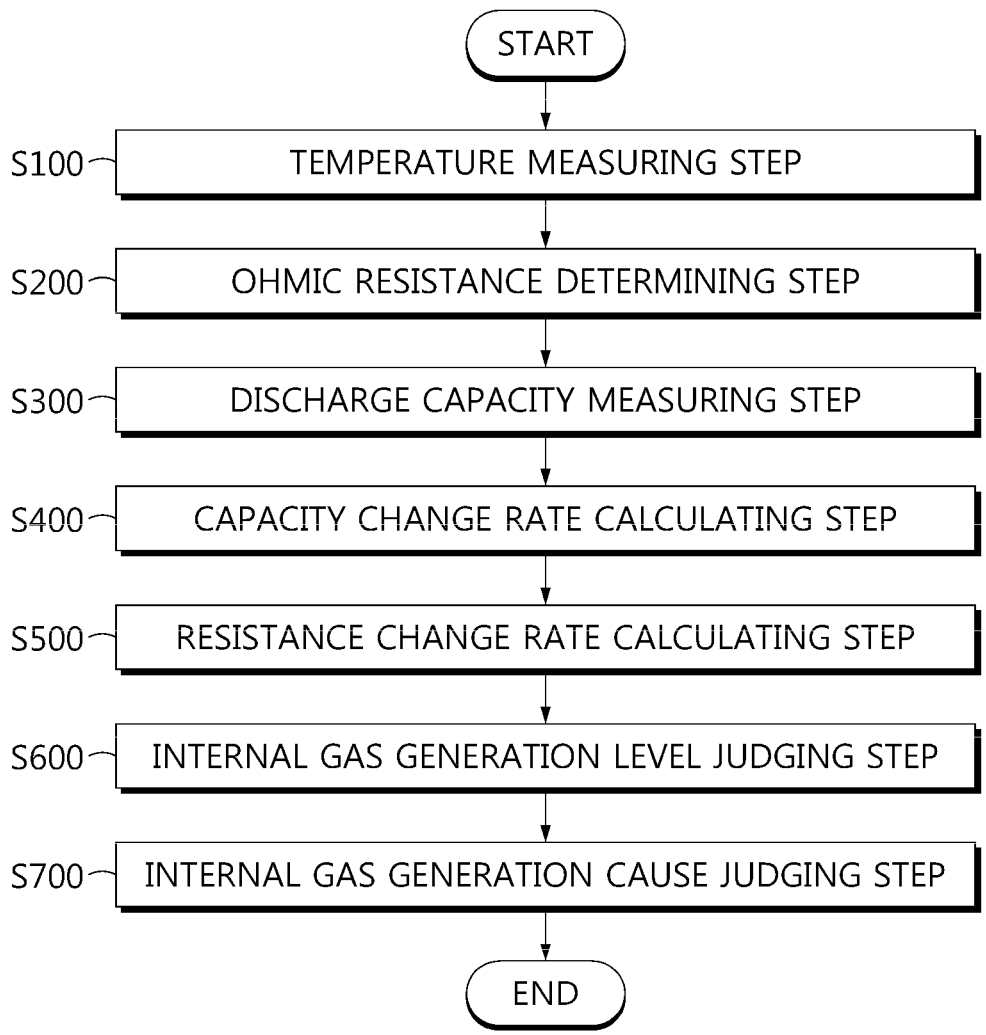
FIG. 8 is a diagram showing a battery diagnosing method according to still another embodiment of the present disclosure.

FIG. 8 is a diagram showing a battery diagnosing method according to still another embodiment of the present disclosure.

Here, each step of the battery diagnosing method may be performed by the battery diagnosing apparatus 100. Hereinafter, for convenience of explanation, content overlapping with the previously described content will be briefly described or omitted.

Referring to FIG. 8, the battery diagnosing method according to an embodiment of the present disclosure may include a temperature measuring step (S100), an ohmic resistance determining step (S200), a discharge capacity measuring step (S300), a capacity change rate calculating step (S400), a resistance change rate calculating step (S500), an internal gas generation level judging step (S600), and an internal gas generation cause judging step (S700).

The temperature measuring step (S100) is a step of measuring the temperature of the battery, and may be performed by the measuring unit 110.

For example, referring to FIGS. 1 and 7, the measuring unit 110 may be connected to a battery through a first sensing line SL1. In addition, the measuring unit 110 may measure the temperature of the battery through the first sensing line SL1.

The ohmic resistance determining step (S200) is a step of determining the ohmic resistance of the battery based on the impedance profile generated for the battery, and may be performed by the ohmic resistance determining unit 120.

For example, the ohmic resistance determining unit 120 may directly receive the impedance profile generated for the battery from the outside, or may access the storage unit 140 to obtain the impedance profile stored in the storage unit 140. In addition, the ohmic resistance determining unit 120 may determine the ohmic resistance of the battery from the impedance profile.

Preferably, the ohmic resistance determining unit 120 may determine the ohmic resistance only for a battery in which the temperature of the battery measured by the measuring unit 110 is equal to or greater than the criterion temperature and this state is maintained for a predetermined period.

The discharge capacity measuring step (S300) is a step of measuring a discharge capacity of the battery, and may be performed by the measuring unit 110.

Preferably, the battery whose temperature is maintained at the criterion temperature or above for a predetermined period may be fully charged again after the predetermined period has elapsed. Thereafter, the fully charged battery may be fully discharged. The measuring unit 110 may measure the discharge capacity of the battery while the fully charged battery is fully discharged.

For example, referring to FIGS. 1 and 7, the measuring unit 110 may be connected to a current measuring element A through a fourth sensing line 5L4. In addition, the measuring unit 110 may measure the discharge capacity of the battery through the current measuring element A.

The capacity change rate calculating step (S400) is a step of calculating a capacity change rate by comparing the discharge capacity of the battery measured in the discharge capacity measuring step (S300) with a reference capacity, and may be performed by the control unit 130.

For example, the control unit 130 may calculate the capacity change rate of the battery by calculating the formula "(reference capacity−measured discharge capacity of the battery)÷reference capacity×100".

The resistance change rate calculating step (S500) is a step of calculating a resistance change rate by comparing the ohmic resistance determined in the ohmic resistance determining step (S200) with a reference resistance, and may be performed by the control unit 130.

For example, the control unit 130 may calculate the resistance change rate of the battery by calculating the formula "(determined ohmic resistance−reference resistance)÷reference resistance×100".

The internal gas generation level judging step (S600) is a step of judging an internal gas generation level of the battery by comparing magnitudes of the calculated resistance change rate and a criterion resistance change rate, and may be performed by the control unit 130.

For example, if the calculated resistance change rate is greater than or equal to the criterion resistance change rate, the control unit 130 may judge that the internal gas of the battery equal to or greater than the criterion amount is generated. Conversely, if the calculated resistance change rate is less than the criterion resistance change rate, the control unit 130 may judge that the internal gas of the battery less than the criterion amount is generated.

The internal gas generation cause judging step (S700) is a step of judging the internal gas generation cause of the battery by comparing the magnitudes of the calculated capacity change rate and the criterion capacity change rate, and may be performed by the control unit 130.

For example, if the calculated capacity change rate is greater than or equal to the criterion capacity change rate, the control unit 130 may judge that the internal gas of the battery is generated by a side reaction of the negative electrode of the battery. Conversely, if the calculated capacity change rate is less than the criterion capacity change rate, the control unit 130 may judge that the internal gas of the battery is caused by another cause other than the side reaction of the negative electrode of the battery.

Furthermore, although not shown in FIG. 8, the battery diagnosing method may further include a battery state diagnosing step after the internal gas generation cause judging step (S700).

The battery state diagnosing step is a step of diagnosing the state of the battery based on the internal gas generation level and the internal gas generation cause, and may be performed by the control unit 130.

Referring to FIG. 5, the control unit 130 may diagnose the state of the battery as a normal state, a first warning state, or a second warning state based on the internal gas generation level and the internal gas generation cause.

For example, the control unit 130 may classify a battery diagnosed as the normal state, the first warning state or the second warning state as a reusable battery. In addition, the control unit 130 may reduce the internal gas generation amount of the battery when the battery is reused by appropriately restricting the operation of the battery diagnosed as the first warning state or the second warning state.

In addition, after the battery state diagnosing step, only when the battery is judged as the first warning state, an additional diagnosing step may be performed to more specifically confirm the internal gas generation cause of the battery.

The additional diagnosing step is a step of diagnosing whether the internal gas generation cause of the battery is the side reaction of the positive electrode, and may be performed by the control unit 130.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery diagnosing system
100: battery diagnosing apparatus
110: measuring unit
120: ohmic resistance determining unit
130: control unit
140: storage unit
200: EIS unit
300: heating unit
400: charging and discharging unit

What is claimed is:

1. A battery diagnosing apparatus, comprising:
a voltage sensor configured to measure a voltage of a battery;
a temperature sensor configured to measure a temperature of the battery;
a controller; and
memory having programmed thereon instructions that, when executed by the controller, cause the controller to:
calculate a capacity change rate by comparing the discharge capacity of the battery with a reference capacity;
calculate a resistance change rate by comparing an ohmic resistance determined based on an impedance profile generated for the battery with a reference resistance;
determine an internal gas generation level of the battery by comparing magnitudes of the calculated resistance change rate and a threshold resistance change rate; and
determine an internal gas generation cause of the battery by comparing magnitudes of the calculated capacity change rate and a threshold capacity change rate.

2. The battery diagnosing apparatus according to claim 1, wherein the ohmic resistance is determined based on the impedance profile generated for the battery in response to the temperature of the battery being equal to or greater than a threshold temperature of the battery for a predetermined duration of time.

3. The battery diagnosing apparatus according to claim 2, further comprising a current sensor configured to measure a discharge current of the battery,
wherein the battery is configured to be maintained at or above the threshold temperature for the predetermined duration of time, and then to be fully charged and then fully discharged, and
wherein the instructions are configured to cause the controller to receive a discharge capacity measurement of the battery based on discharge measurements of the current sensor, wherein the discharge capacity measurement is indicative of a discharge capacity of the battery between being fully charged and being fully discharged.

4. The battery diagnosing apparatus according to claim 1, wherein the instructions are configured to cause the controller to:
determine that an internal gas of the battery equal to or greater than a threshold amount is generated in response to the calculated resistance change rate being equal to or greater than the threshold resistance change rate; and
determine that an internal gas of the battery less than the threshold amount is generated in response to the calculated resistance change rate being less than the threshold resistance change rate.

5. The battery diagnosing apparatus according to claim 4, wherein the instructions are configured to cause the controller to:
determine that the internal gas generation cause is a side reaction of a negative electrode of the battery in response to the calculated capacity change rate being equal to or greater than the threshold capacity change rate; and
determine that the internal gas generation cause is a cause other than the side reaction of the negative electrode in response to the calculated capacity change rate being less than the criterion capacity change rate.

6. The battery diagnosing apparatus according to claim 5, wherein the instructions are configured to cause the controller to diagnose a state of the battery based on the internal gas generation level and the internal gas generation cause.

7. The battery diagnosing apparatus according to claim 6, wherein the instructions are configured to cause the controller to diagnose that the state of the battery is a normal state in response to the internal gas generation level being less than the threshold amount.

8. The battery diagnosing apparatus according to claim 6, wherein the instructions are configured to cause the controller to:
diagnose that the state of the battery is a first warning state in response to the internal gas generation level being greater than or equal to the threshold amount; and
reduce an upper limit temperature for the battery in response to the state of the battery being the first warning state.

9. The battery diagnosing apparatus according to claim 6, wherein the instructions are configured to cause the controller to diagnose that the state of the battery is a second warning state in response to the internal gas generation level being equal to or greater than the threshold amount and being generated due to the side reaction of the negative electrode; and
reduce at least one of an upper limit temperature and an upper limit C-rate for the battery in response to the state of the battery being the second warning state.

10. A battery diagnosing system, comprising:
the battery diagnosing apparatus according to claim 1; and
an electrochemical impedance spectroscopy (EIS) instrument configured to:
output an AC current to the battery;
generate the impedance profile of the battery according to an output result of the AC current as a corresponding relationship between a real part and an imaginary part; and
output the generated impedance profile to the battery diagnosing apparatus.

11. The battery diagnosing system according to claim 10, further comprising:
- a heater configured to raise the temperature of the battery to a raised temperature equal to or greater than a threshold temperature; and
- a charging and discharging unit configured to charge and discharge the battery.

12. A battery pack, comprising the battery diagnosing apparatus according to claim 1.

13. A battery diagnosing method, comprising:
- measuring, by a temperature sensor, a temperature of a battery;
- measuring, by a current sensor, a discharge current of the battery;
- receiving, by a controller, a discharge capacity of the battery based on discharge current measurements of the current sensor;
- calculating, by a controller, a capacity change rate by comparing the received discharge capacity of the battery with a reference capacity;
- calculating, by the controller, a resistance change rate by comparing an ohmic resistance of the battery determined based on an impedance profile generated for the battery with a reference resistance;
- determining, by the controller, an internal gas generation level of the battery by comparing magnitudes of the calculated resistance change rate and a threshold resistance change rate; and
- determining, by the controller, an internal gas generation cause of the battery by comparing magnitudes of the calculated capacity change rate and a threshold capacity change rate.

* * * * *